United States Patent
Mao et al.

(10) Patent No.: US 8,324,112 B2
(45) Date of Patent: Dec. 4, 2012

(54) WET ETCHING AGENT FOR II-VI SEMICONDUCTORS AND METHOD

(75) Inventors: Guoping Mao, Woodbury, MN (US); Michael W. Bench, Eagan, MN (US); Zai-Ming Qiu, Woodbury, MN (US); Xiaoguang Sun, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 88 days.

(21) Appl. No.: 12/945,985

(22) Filed: Nov. 15, 2010

(65) Prior Publication Data

US 2011/0117750 A1 May 19, 2011

Related U.S. Application Data

(60) Provisional application No. 61/262,343, filed on Nov. 18, 2009.

(51) Int. Cl.
*H01L 21/302* (2006.01)
*H01L 21/461* (2006.01)

(52) U.S. Cl. .................. 438/745; 257/E21.485
(58) Field of Classification Search .................. 438/745; 257/E21.485
See application file for complete search history.

(56) References Cited

U.S. PATENT DOCUMENTS

| 3,647,699 A | 3/1972 | Doty |
| 5,404,027 A | 4/1995 | Haase |
| 5,538,918 A | 7/1996 | Haase |
| 2004/0096584 A1* | 5/2004 | Naruskevicius et al. ..... 427/306 |
| 2004/0118805 A1* | 6/2004 | Hareland et al. ................ 216/13 |
| 2006/0124917 A1 | 6/2006 | Miller |
| 2006/0124918 A1 | 6/2006 | Miller |

FOREIGN PATENT DOCUMENTS

WO  WO 2009075973  6/2009

OTHER PUBLICATIONS

Dzhabiev, Formation of Ozone During the Reduction of Potassium Permanganate in Sulfuric Acid Solutions, Russian Journal of Physical Chemistry, vol. 79, No. 11, pp. 1755-1760, (2005).

Ebina, Crystallographic Polarity and Etching Behavior of ZnSe, Japanese Journal of Applied Physics, vol. 16, No. 9, pp. 1563-1570, (Sep. 1977).

Tamura, Chemical Etching of ZnSe Crystals, Journal of Electronic Materials, vol. 23, No. 8, pp. 835-838, (1994).

Tomashik Chemical Polishing of II-VI Semiconductors, Inorganic Materials, vol. 33, No. 12, pp. 1230-1233, (1997).

* cited by examiner

*Primary Examiner* — Nadine Norton
*Assistant Examiner* — Mahmoud Dahimene
(74) *Attorney, Agent, or Firm* — Steven E. Skolnick

(57) ABSTRACT

A novel etching agent for etching II-VI semiconductors is provided. The etching agent includes an aqueous solution of potassium permanganate and phosphoric acid. This etching solution can etch II-VI semiconductors at a rapid rate but tend to be much less reactive with III-V semiconductors. The provided agent can be used in a method for etching II-VI semiconductors.

18 Claims, No Drawings

WET ETCHING AGENT FOR II-VI SEMICONDUCTORS AND METHOD

CROSS REFERENCE TO RELATED APPLICATION

This application claims the benefit of U.S. Provisional Patent Application No. 61/262,343, filed Nov. 18, 2009, the disclosure of which is incorporated by reference herein in its entirety.

FIELD

The provided disclosure relates to etching of II-VI semiconductors.

BACKGROUND

The rapid development of optoelectronics has produced a desire for methods of producing nanometer-sized patterns on semiconductor surfaces. Typically, these patterns can be etched into semiconductor substrates by a number of techniques. For example, wet chemical etching has been used to etch a wide variety of semiconductors. Typically, for the case of II-VI semiconductors such as ZnSe, wet chemical etching utilizes bromine-based chemistries. Wet chemical etching proceeds by oxidation of the semiconductor constituents followed by chemical dissolution of the oxides in suitable solvents.

Currently $Br_2$—HBr based etching solutions can be used for producing smooth, defect-free surfaces or for patterning II-VI semiconductors. This bromine-based etchant works very well for II-VI semiconductors such as those, for example, that can be used for the fabrication of down-converters to modify the wavelengths of laser diodes or light emitting diodes (LEDs). A big drawback in using bromine-based etchant solutions is that they exhibit storage instability. The instability is due to evaporation of bromine as well as side reactions in which bromine is consumed. Furthermore, since the etching rate is proportional to the concentration of bromine, the control of etch depth can be poor in the absence of an etch stopper.

SUMMARY

Thus, there is a need for stable wet etchants for II-VI semiconductors. There is also a need for wet etchants that can be stored for long periods and maintain their reactivity. Additionally, there is a need for wet etchants that can react rapidly with II-VI semiconductors but not with other semiconductor materials. Finally, there is a need for wet etchants for II-VI semiconductors that are safer to handle and to use.

In one aspect, a method of etching a semiconductor is provided that includes contacting at least a portion of a surface of a II-VI semiconductor with an etchant comprising potassium permanganate and phosphoric acid, removing at least a portion of the II-VI semiconductor to form an etched II-VI semiconductor, and rinsing the etched II-VI semiconductor to remove the etchant.

In another aspect, a method of etching a semiconductor is provided that includes providing a II-VI semiconductor disposed upon of a III-V semiconductor, contacting at least a portion of a surface of the II-VI semiconductor with an etchant comprising potassium permanganate and phosphoric acid, removing at least a portion of the II-VI semiconductor to form an etched II-VI semiconductor; and rinsing the etched II-VI semiconductor to remove the etchant.

Finally, in yet another aspect, an etching solution is provided that includes an aqueous solution comprising potassium permanganate and phosphoric acid, wherein the concentration of potassium permanganate is from about 0.01 moles/liter to about 0.1 moles/liter and the concentration of phosphoric acid from about 1.5 moles/liter to about 4.5 moles/liter, wherein the aqueous solution is stable for at least one week at room temperature.

In this disclosure:

"disposed upon" means directly contacting the layer beneath;

"room temperature" refers to temperatures about 25° C. at ambient pressure;

The above summary is not intended to describe each disclosed embodiment of every implementation of the present invention. The detailed description which follows more particularly exemplify provided embodiments.

DETAILED DESCRIPTION

It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

A method of wet etching a II-VI semiconductor is provided. The provided method can be utilized to remove surface defects on a face of the semiconductor. Alternatively, the provided method can be used to etch the semiconductor through a mask to make very small etched structures on the etched surface. The etching can be rapid, selective, and the etching solution can be stored for long periods of time without decomposition.

The provided process is useful for etching II-VI semiconductor materials such as, for example, materials that can include cadmium, calcium, beryllium, magnesium, zinc, selenium, mercury, tellurium, zinc, sulfur, or combinations thereof. II-VI semiconductors include at least one element from Group II elements that include beryllium (Be), magnesium (Mg), zinc (Zn), cadmium (Cd), and mercury (Hg) and they include at least one element from Group VI elements that include chromium (Cr), molybdenum (Mo), tungsten (W), sulfur (S), selenium (Se), and tellurium (Te). An exemplary II-VI semiconductor material can include CdMgZnSe alloy. Other II-VI semiconductor materials such as CdZnSe, ZnSSe, ZnMgSSe, ZnSe, ZnTe, ZnSeTe, HgCdSe, and HgCdTe can also be etched using the provided process. Binary II-VI semiconductor materials include, for example, BeSe, CdSe, MgSe, ZnSe, BeTe, CdTe, MgTe, ZnTe, BeS, CdS, MgS, ZnS and alloys thereof. II-VI semiconductors are well known to those of ordinary skill in the art and can be made, for example, using molecular beam epitaxy as disclosed, for example, in U.S. Pat. Nos. 5,538,918 and 5,404,027 (Haase et al.).

II-VI semiconductors can be chemically polished to produce high-quality semiconductor surfaces that are structurally perfect, flat, chemically homogeneous, and useful in the fabrication of semiconductor devices. A review of polishing II-VI semiconductors is disclosed by Tomashick et al., *Inorganic Materials*, 33(12), 1230 (1997). For example, a solution of 0.5 N $KMnO_4$ in 7 $NH_2SO_4$ can polish the surface of ZnSe single crystals in a matter of minutes. But, KMnO4 can be reduced by H2SO4 to form ozone as is reported by Dzhabiev et al., *Russian Journal of Physical Chemistry*, 79 (11), 1755 (2005). Bromine in methanol can also be used to polish not only II-VI but also a wide variety of other compound semiconductors. However, during storage in a closed vessel, the concentration of bromine in such solutions decreases notably, and the solution acidity arises since the components of this etchant solution form acetic acid.

We have found that solutions of $KMnO_4$ in $H_3PO_4$ effectively etch II-VI semiconductors at reasonable etch rates and that the etching solutions remain stable after weeks of storage in closed containers at room temperature (about 25° C.). For example, a solution of 120 mg potassium permanganate in 5.0 ml of 85% $H_3PO_4$ and 20 mL of water was found to etch a CdMgZnSe alloy II-VI semiconductor at a rate of 24.2 nm/sec at room temperature. The same solution etched an InP semiconductor at a rate of 1.0 nm/sec. Thus, InP, which is a III-V semiconductor material, can be used as an etch stop when etching II-VI semiconductors if the II-VI semiconductor is epitaxially grown on an InP substrate.

The etching rate of II-VI semiconductors using solutions of potassium permanganate in phosphoric acid are a function of the semiconductor, the concentration of permanganate, and the temperature. Typically, wet etching of II-VI semiconductors is done with an etchant that comprises an aqueous solution of potassium permanganate and phosphoric acid. The concentration of potassium permanganate can be from about 0.01 moles/liter to about 0.1 moles/liter and the concentration of phosphoric acid can be greater than about 1.5 moles/liter to about 4.5 moles/liter. When the concentration of potassium permanganate is greater than about 0.1 moles/liter, very rough etched surfaces have been observed. The etching rate of II-VI semiconductors in this etchant is proportional to the concentration of potassium permanganate. This is shown in more detail in the Example section below. The potassium permanganate can be at a concentration from about 0.02 moles/liter to about 0.05 moles/liter. An exemplary solution of 220 mg (1.39 mmoles) $KMnO_4$, 10 ml of 85% $H_3PO_4$, and 40 mL water having a concentration of 0.028 moles/liter $KMnO_4$ showed no deterioration by change in color of the solution or in etch rate of a II-VI semiconductor when stored for over 75 days at room temperature.

The etchant comprising an aqueous solution of potassium permanganate and phosphoric acid can further comprise a surfactant. Useful surfactants include fluorinated surfactants such as the acid or salt of perfluorinated carboxylic or sulfonic acids. Exemplary fluorinated surfactants useful in the provided etching methods include perfluoropropionic acid, perfluorobutyric acid, perfluoropentanoic acid, perfluorohexanoic acid, and perfluorobutanesulfonic acid. Also included are the salts of these perfluorinated acids. Salts can include cations such as sodium, potassium, ammonium, and alkyl substituted ammonium salts such as, for example, n-$C_4F_9C(O)O^-NH_4^+$, n-$C_4F_9C(O)O^-N(CH_3)_4^+$, n-$C_4F_9C(O)O^-N(R)_4$. Other useful surfactants include sodium dodecyl sulfate (SDS).

The provided method of etching a semiconductor includes providing a II-VI semiconductor as specified above. At least a portion of a surface of the II-VI semiconductor is contacted with an etchant solution comprising potassium permanganate and phosphoric acid. The etchant solution is described above and exemplified in the Example section that follows. The etchant solution can be made to contact the II-VI semiconductor in a number of ways. The semiconductor can be at least partially submerged in a solution of the etchant by dipping it into such a solution. Alternatively, the II-VI semiconductor can have the etching solution applied to it by spraying, coating, painting, flowing or otherwise allowing the etching solution to contact at least a portion of the II-VI semiconductor. After a period of time, at least a portion of the II-VI semiconductor is removed from contacting the etchant solution. By removed from contacting it is meant that the semiconductor is removed from contact with the bulk of fresh etchant. This can be accomplished, for example, by removing the semiconductor from a solution into which it has been immersed, stopping the spraying, coating, painting, flowing, or other contacting method of the etchant with the semiconductor, or any other manner of physically separating the semiconductor from fresh etchant solution. Finally, the II-VI semiconductor can be rinsed to remove any residual etchant from being in contact with the semiconductor. Rinsing can be done with any solution in which the etchant is soluble and which will not react with the II-VI semiconductor. Typically, rinsing solutions include water, low molecular weight alcohols such as methanol or ethanol, or other solvents which are miscible with aqueous solutions such as tetrahydrofuran, dioxetane, or other similar solvents. The II-VI semiconductor is typically etched at room temperature. However, when faster, less controlled etching is desired, the temperature of the etchant and the semiconductor can be elevated.

The provided method of etching a semiconductor is typically done with a solution of phosphoric acid that has been diluted with a solvent, usually water, so that the concentration of phosphoric acid in the final etchant solution is from about 1.5 moles/liter to about 4.5 moles/liter. Typically concentrations of phosphoric acid in the etchant solution can be from about 2.0 moles/liter to about 4.0 moles/liter, or even from about 2.5 moles/liter to about 3.5 moles/liter. The etching rate of II-VI semiconductors doesn't seem to vary much with composition and is also proportional to the concentration of potassium permanganate. Typically the etchant has a concentration of potassium permanganate from about 0.01 moles/liter to about 0.1 moles/liter, or from about 0.02 moles/liter to about 0.05 moles/liter. Also, typically the II-VI semiconductor is etched away at a rate of greater than about 50 nm/sec at room temperature.

In the provided etchant solutions, III-V semiconductors such as, for example, InP, are much less reactive with the etchant solution of potassium permanganate in phosphoric acid. In fact, the provided etchant solutions at room temperature, the rate of etching the II-VI semiconductor is at least about 5, at least about 10, at least about 20, or even at least about 25 times faster than that of the III-V semiconductor. This allows III-V semiconductors such as, for example, InP to be used as an etch stop. For example a II-V semiconductor can be epitaxially grown on a III-V semiconductor substrate with InP etch stop layer. Using such a combination and the provided etchant, it is possible to etch through the II-VI semiconductor without etching through very much of the InP etch stop layer. If a patterned mask is applied prior to etching to the top surface of the II-VI semiconductor in such a system, then the exposed part of the II-VI semiconductor (unmasked portion) can be easily etched down to the etch stop. Masks for such applications can include photoresist masks or other masks that can be used to pattern semiconductors in lithographic processes. These masks and the process of applying and removing them are well known to those of ordinary skill in the art.

Finally an etching solution as described above and in the Example section below is provided that includes an aqueous solution of potassium permanganate and phosphoric acid where the concentrations of potassium permanganate and phosphoric acid are as stated above and the solution is stable for at least one week at room temperature. Stability is usually determined by observing the purple color of the permanganate ion in solution fade away. Additionally, the degraded etchant solution is much less reactive towards etching II-VI semiconductors than the original etchant solution. Provided etchant solutions can stay stable at room temperature when placed in a stoppered container for at least 30 days, at least 60 days, at least 75 days, or even longer with no substantial decrease in etching ability.

The provided method and etching solution used therein can be useful for the fabrication of electrical and optical devices such as, for example, laser diodes, light-emitting diodes, and for light extracting elements thereon or used therewith.

Objects and advantages of this invention are further illustrated by the following examples, but the particular materials and amounts thereof recited in these examples, as well as other conditions and details, should not be construed to unduly limit this invention.

EXAMPLES

All parts, percentages, ratios, etc. in the examples and the rest of the specification are by weight, unless noted otherwise. Solvents and other reagents used were obtained from Aldrich Chemical Company, Milwaukee, Wis. unless otherwise noted.

Materials

Table 1 below provides a list of chemicals used, their concentrations as well as supplier information.

TABLE 1

Materials Used

| Name | Concentration, weight % | Supplier |
|---|---|---|
| $KMnO_4$ | 99+% | Aldrich Chemical Company, Milwaukee, WI |
| $H_2SO_4$ | 95% | J. T. Baker Chemicals, Phillipsburg, NJ |
| $H_3PO_4$ | 85% | EMD Chemicals, Gibbstown, NJ |
| $CH_3COOH$ | 100% | J. T. Baker Chemicals, Phillipsburg, NJ |
| $n\text{-}C_3F_7COOH$ | 98% | Aldrich Chemical Company, Milwaukee, WI |
| $n\text{-}C_4F_9COOH$ | 99+% | Aldrich Chemical Company, Milwaukee, WI |
| $n\text{-}C_4F_9SO_3K$, $n\text{-}C_4F_9SO_3NH_4$, $n\text{-}C_4F_9SO_3H$ | 98% | Aldrich Chemical Company, Milwaukee |
| Sodium Dodecyl Sulfate (SDS) | 99+% | Aldrich Chemical Company, Milwaukee, WI |
| HBr | 48% | Aldrich Chemical Company, Milwaukee, WI |
| $Br_2$ | 99.5+% | Aldrich Chemical Company, Milwaukee, WI |

General Method for Preparing Etchant Compositions and Etch Testing of II-VI Semiconductor Samples.

The exemplified etchant compositions were prepared by adding the desired amount of acid to deionized (DI) water to obtain desired concentration (i.e., desired dilution) of the acid. After cooling to room temperature (in the case of $H_3PO_4$, not much heat was given off during dilution with water), the desired amount of $KMnO_4$ was added to the dilute acid solution while stirring. Finally, the desired amount of surfactant, if present, was added, with stirring.

The II-VI semiconductor materials to be etched were cut to about 2 mm×3 mm size and half of their surface was protected using a tape (3M SCOTCH Tape #8403; with silicone adhesive, commercially available from 3M Company, St. Paul, Minn.). Etching was carried out at room temperature by immersing the II-VI semiconductor test samples into the etchant using a TEFLON clamp. The etchant was gently stirred by hand (unless noted otherwise) for the etching process. Etching time was generally from 10 seconds to a few minutes. For slower etching processes, 10 minutes or longer time was used. After etching for a predetermined length of time, the II-VI semiconductor samples were removed from the etchant and cleaned thoroughly with DI water and then dried. The etched thicknesses were measured in the center of the etched portion of the samples by a Dektak Profilometer (KLA Tencor Corporation, San Jose, Calif.). The etch rate was then calculated. Generally, at least two measurements were carried out for etch rate measurement.

Table 2 below summarizes the II-VI semiconductor materials used in the examples below and their properties. The samples were grown by molecular beam epitaxy (MBE) in a Perkin Elmer MBE system. This system included one growth chamber equipped with a Veeco Arsenic cell, In and Ga Knudsen cells for the growth of GaInAs buffer layers on InP substrates. A second chamber, connected by an ultrahigh vacuum pipeline, contained Knudsen cells for Be, Cd, Mg, Te, Zn, and $ZnCl_2$ (Cl-doping source), and a valved source for Se. GaInAs buffer layers were grown in the first chamber at a temperature of about 520° C. to a thickness of about 200 nm. The samples were then cooled and transferred through the ultra-high vacuum pipeline to the second chamber, and II-VI CdMgZnSe layers were grown at about 270° C. in the second chamber. Using the described procedure four II-VI semiconductor crystals containing CdMgZnSe were grown on GaInAs buffer layers and are herein referred to as SC-1, SC-2, SC-3, and SC-4

Table 2 below summarizes the etchant compositions used in the examples below.

TABLE 2

Etchant Solutions

| Etchant | Acid Type | Acid Amount, mL | $KMnO_4$, mg | DI Water, mL |
|---|---|---|---|---|
| Comparative A | $H_2SO_4$ | 7.5 | 100 | 15.5 |
| Comparative B | $H_2SO_4$ | 7.5 | 100 | 32 |
| Comparative C | $H_2SO_4$ | 7.5 | 210 | 32 |
| Comparative D | $CH_3COOH$ | 5 | 112 | 20 |
| A | $H_3PO_4$ | 5 | 120 | 20 |
| B | $H_3PO_4$ | 2.5 | 120 | 22.5 |
| C | $H_3PO_4$ | 10 | 120 | 15 |
| D | $H_3PO_4$ | 5 | 150 | 20 |
| E | $H_3PO_4$ | 5 | 90 | 20 |
| F | $H_3PO_4$ | 5 | 60 | 20 |
| G | $H_3PO_4$ | 5 | 180 | 20 |
| H | $H_3PO_4$ | 1.25 | 120 | 23.8 |
| I | $H_3PO_4$ | 0.6 | 120 | 24.5 |
| J | $H_3PO_4$ | 1.8 | 120 | 23.2 |
| K | $H_3PO_4$ | 7.5 | 120 | 17.5 |
| M | $H_3PO_4$ | 5 | 1090 | 20 |
| N | $H_3PO_4$ | 5 | 605 | 20 |
| P | $H_3PO_4$ | 5 | 847.5 | 20 |
| Q | $H_3PO_4$ | 10 | 220 | 40 |

Example 1

For example 1, SC-1 semiconductor and InP substrate samples were etched as described above using etchants A and Comparative A, Comparative B, Comparative C, Comparative D. Table 3 summarizes the etching test data for Example 1.

TABLE 3

| Etchant | Etch Time, sec | II-VI Semiconductor Etched Thickness, nm | II-VI Semiconductor Etch Rate, nm/sec | InP Substrate Etch Rate, nm/sec |
|---|---|---|---|---|
| Comparative A | 120 | 2100 | 17.5 | — |
| Comparative B | 120 | 860 | 7.2 | — |
| Comparative C | 60 | 2200 | 36.7 | 1.8 |
| Comparative D | 210 | 45 | 0.21 | — |
| A | 90 | 2200 | 24.4 | 1.0 |

The etchants Comparative A, Comparative B, Comparative C and Comparative D were not stable after 24 hours as determined by the disappearance of bright purple color of $KMnO_4$ and by formation of precipitates. On the other hand, Etchant A was stable and provided good etch rate for II-VI semiconductor sample.

Example 2

II-VI semiconductors were etched according to the process described above using etchants according to the invention which had a constant $H_3PO_4$ concentration of 2.92 M but, with varying amounts of $KMnO_4$ concentrations. Table 4 below summarizes etching test data for Example 2.

TABLE 4

Etch Rate of II-VI Semiconductors as a Function of [$KMnO_4$]

| Etchant | KMnO4 Concentration, M | Etch Rate for II-VI Semiconductor, nm/sec SC-1 | SC-2 |
|---|---|---|---|
| D | 0.0387 | 51.3 | |
| E | 0.0215 | 27.7 | |
| F | 0.0129 | 19.7 | |
| G | 0.0473 | 70 | |
| A | 0.03 | 37.5 | |
| M | 0.137 | | 81.5 |
| N | 0.0835 | | 131.7 |
| P | 0.110 | | 66.77 |

The data show that the II-VI semiconductor etch rate is proportional to concentration of $KMnO_4$ from 0.01M to about 0.1M. When the concentration of $KMnO_4$ was higher than 0.1M, very rough etched surfaces were observed.

Example 3

II-VI semiconductors were etched according to the process described above using etchants according to the invention which had a constant $KMnO_4$ concentration of 0.03 M but, with varying concentrations of $H_3PO_4$. Table 5 below summarizes etching test data for Example 3.

TABLE 5

Etch Rate of II-VI Semiconductors as a Function of [$H_3PO_4$]

| Etchant | $H_3PO_4$ Concentration, M | Etch Rate for SC-3 II-VI Semiconductor, nm/sec |
|---|---|---|
| A | 2.92 | 36.2 |
| B | 1.46 | 36 |
| C | 5.84 | 18.5 |
| H | 0.73 | 6.7 |
| I | 0.37 | 5.8 |
| J | 1.10 | 15.0 |
| K | 4.38 | 34.0 |

The data show that the $H_3PO_4$ concentration has a large impact on II-VI semiconductor etch rate and etching characteristics as well. However, from 1.5 M to 4.5 M, the impact of $H_3PO_4$ concentration on II-VI semiconductor etch rate is small.

Example 4

The etch rate achieved for II-VI semiconductor samples of varying compositions and for InP substrate using etchant A were determined using the general method described above. The results are summarized in Table 6.

TABLE 6

Etch Rate of II-VI Semiconductor and InP

| Sample | Etch rate, nm/sec |
|---|---|
| SC-4 | 33 |
| InP Substrate | 1 |

Example 5

Example 5 was run to determine the effect of stirring and stirring rate on the etch rate of a II-VI semiconductor (SC-2) with Etchant A modified with varying amounts of sodium dodecyl sulfate (SDS, $C_{12}H_{25}SO_3Na$), a surfactant. For the etching experiments with stirring, the stirring was accomplished by using a magnetic stirrer (Corning Magnetic Stirrer Model RCT obtained from VWR, West Chester, Pa.) and a 3.84 cm stirring bar. A stirring rate of "low" means the stir rate was set to 6 on the magnetic stirrer while a stirring rate of "high" means sir rate was set to 7 on the magnetic stirrer. The etch rate data is summarized below in Table 7.

TABLE 7

Effect of Stirring and Surfactant on Etching Rate

| Etchant Type | % Surfactant | Etch rate, nm/sec No Stirring | "Low" Stirring | "High" Stirring |
|---|---|---|---|---|
| A | 0 | 2.2 | 43 | Not determined |
| A + SDS Surfactant | 0.05% SDS | 2.6 | 30 | 47 |
| A + SDS Surfactant | 0.1% SDS | 3.4 | 35 | 46 |
| A + SDS Surfactant | 0.2% SDS | Not determined | Not determined | 43 |

Example 6

The stability of Etchant A with a large amount of surfactant and small amount of $KMnO_4$ in $H_3PO_4$ (molar ratio of [surfactant]/[$KMnO_4$]>10) was studied. A fading of the purple color associated with $KMnO_4$ was taken as an indicator of etchant instability. Surfactant modified etchants that lost their purple color within a week were rated as unstable. Table 8 summarizes the stability data for Etchant A modified with various surfactants.

TABLE 8

Effect of Fluorinated and Unfluorinated Surfactants on Etchant Stability

| Surfactant | Stability of Etchant A + Surfactant |
|---|---|
| Sodium Dodecyl Sulfate (SDS) | Not stable |
| n-$C_3F_7$COOH | Stable |
| n-$C_4F_9$COOH | Stable |
| n-$C_4F_9SO_3K$ | Stable |

Example 7

Example 7 was run to demonstrate the stability of various etchants according to the invention over a period of more than 2 months. For the example, the etch rates for each etchant were determined using the method described above for II-VI semiconductor samples SC-3. Then the etchant solutions were kept under ambient lab conditions for the duration of the experiments (over 70 days). The etch rates for each etchant were then again determined using each of the aged etchants using the same method and the same II-VI semiconductor (SC-3) samples. Table 9 summarizes the initial and final etch rates for various etchant compositions according to the invention as well as the duration of the experiments.

TABLE 9

| Etchant | Initial etch rate, nm/sec | Final etch rate, nm/sec | Aging time, days |
|---|---|---|---|
| Q | 43 | 41.5 | 78 |
| Q + 0.1% $C_4F_9$COOH | — | 42.5 | 77 |
| Q + 0.1% $C_4F_9SO_3K$ | 43 | 41 | 71 |

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. A method of etching a semiconductor comprising:
   providing a II-VI semiconductor comprising II-VI semiconductor material;
   contacting at least a portion of the II-VI semiconductor material with an etchant comprising potassium permanganate and phosphoric acid;
   removing at least a portion of the II-VI semiconductor material from contact with the etchant to form an etched II-VI semiconductor; and
   rinsing the etched II-VI semiconductor to remove the etchant.

2. A method of etching a semiconductor according to claim 1, wherein the II-VI semiconductor is etched at room temperature.

3. A method of etching a semiconductor according to claim 2, wherein the II-VI semiconductor material comprises cadmium, beryllium, magnesium, zinc, selenium, mercury, tellurium, zinc, sulfur, or combinations thereof.

4. A method of etching a semiconductor according to claim 3, wherein the II-VI semiconductor material comprises cadmium, magnesium, selenium, zinc, or combinations thereof.

5. A method of etching a semiconductor according to claim 2, wherein the etchant comprises an aqueous solution of potassium permanganate and phosphoric acid.

6. A method of etching a semiconductor according to claim 5, wherein the concentration of phosphoric acid in the etchant is from about 1.5 moles/liter to about 4.5 moles/liter.

7. A method of etching a semiconductor according to claim 5, wherein the concentration of potassium permanganate is from about 0.01 moles/liter to about 0.1 moles/liter.

8. A method of etching a semiconductor according to claim 7, wherein the concentration of potassium permanganate is from about 0.01 moles/liter to about 0.05 moles/liter.

9. A method of etching a semiconductor according to claim 2, wherein the II-VI semiconductor is etched a rate of greater than about 50 nm/sec.

10. A method of etching a semiconductor according to claim 1, wherein the II-VI semiconductor is rinsed with water.

11. A method of etching a semiconductor according to claim 1, wherein the etchant further comprises a surfactant.

12. A method of etching a semiconductor according to claim 11, wherein the surfactant comprises a fluorinated surfactant.

13. A method of etching a semiconductor according to claim 12, wherein the surfactant comprises perfluorobutyric acid, perfluorobutanesulfonic acid, its salt, or a combination thereof.

14. A method of etching a semiconductor comprising:
   providing a II-VI semiconductor disposed upon a III-V semiconductor, the II-VI semiconductor comprising II-VI semiconductor material;
   contacting at least a portion of the II-VI semiconductor material with an etchant comprising potassium permanganate and phosphoric acid;
   removing at least a portion of the II-VI semiconductor material from contact with the etchant to form an etched II-VI semiconductor; and
   rinsing the etched II-VI semiconductor to remove the etchant.

15. A method of etching a semiconductor according to claim 14, wherein the rate of etching of the II-VI semiconductor is at least ten times faster than the rate of etching of the III-V semiconductor.

16. A method of etching a semiconductor according to claim 15, wherein the II-VI semiconductor material comprises cadmium, zinc, selenium, magnesium, or a combination thereof.

17. A method of etching a semiconductor according to claim 16, wherein the III-V semiconductor comprises InP.

18. A method of etching a semiconductor according to claim 14, wherein the etchant further comprises a fluorinated surfactant.

* * * * *

UNITED STATES PATENT AND TRADEMARK OFFICE
CERTIFICATE OF CORRECTION

PATENT NO.         : 8,324,112 B2
APPLICATION NO.    : 12/945985
DATED              : December 4, 2012
INVENTOR(S)        : Mao et al.

It is certified that error appears in the above-identified patent and that said Letters Patent is hereby corrected as shown below:

Column 3
Line 63, Delete "$N(R)_4$." and insert -- $N(R)_4^+$. --, therefor.

Signed and Sealed this
Fifth Day of March, 2013

Teresa Stanek Rea
*Acting Director of the United States Patent and Trademark Office*